United States Patent
Ramspacher et al.

(10) Patent No.: US 6,545,871 B1
(45) Date of Patent: Apr. 8, 2003

(54) APPARATUS FOR PROVIDING HEAT DISSIPATION FOR A CIRCUIT ELEMENT

(75) Inventors: Robert James Ramspacher, Fishers, IN (US); Kevin Charles Knoke, Fishers, IN (US); Arnold Kay Walker, Lebanon, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/698,738

(22) Filed: Oct. 27, 2000

(51) Int. Cl.[7] .................................................. H05K 7/20
(52) U.S. Cl. ....................... 361/709; 361/704; 361/707; 361/719; 174/16.3; 174/252; 165/80.2; 165/80.3; 165/185
(58) Field of Search ................................ 361/704, 707, 361/709, 713, 715, 719–721, 818; 174/16.3, 252; 165/80.3, 104.33

(56) References Cited

U.S. PATENT DOCUMENTS

| | | | | |
|---|---|---|---|---|
| 5,060,114 A | * | 10/1991 | Feinberg et al. | 361/706 |
| 5,590,026 A | * | 12/1996 | Warren et al. | 361/704 |
| 6,034,874 A | * | 3/2000 | Watanabe | 361/704 |
| 6,094,348 A | * | 7/2000 | Kanbayashi et al. | 361/704 |
| 6,205,027 B1 | * | 3/2001 | Nakajima | 361/719 |
| 6,239,972 B1 | * | 5/2001 | Tehan et al. | 361/704 |

* cited by examiner

*Primary Examiner*—Boris Chervinsky
(74) *Attorney, Agent, or Firm*—Joseph S. Tripoli; Robert D. Shedd; Reitseng Lin

(57) ABSTRACT

An arrangement for dissipating heat from a circuit element attached to a printed circuit board, comprising: a heatsink having a pair of arms, each one of the arms having tips including bumps, and a structure coupled to the printed circuit board on at least two sides. The structure has holes structured and arranged to allow each of the bumps on the tips of the arms to fit into the holes of the structure.

3 Claims, 2 Drawing Sheets

US 6,545,871 B1

APPARATUS FOR PROVIDING HEAT DISSIPATION FOR A CIRCUIT ELEMENT

FIELD OF THE INVENTION

The invention relates to the cooling of a circuit element, and, more particularly, the invention relates to an apparatus for dissipating heat from a circuit element mounted on a printed circuit board.

BACKGROUND OF THE DISCLOSURE

In general, heatsinks dissipate heat away from integrated circuits (ICs) to the surrounding air. Presently, there are two main approaches to installing such heatsinks. In the first approach, the heatsink is bonded to the top of the IC. In bonding, the bond line between the IC and the heatsink must be sufficiently thin to ensure minimal thermal resistance through the bonding material.

Unfortunately, delamination of the heatsink can result if the IC generates too much heat. The loose heatsink could come in contact with other circuitry and cause an electrical short, and the now improperly bonded heatsink will not dissipate heat from the IC. Bonding is thus a poor solution when maximal heat dissipation is required.

In the second approach, the heatsink is mechanically mounted to the printed circuit board (PCB) such that the IC is sandwiched between the heatsink and the PCB. Specifically, the heatsink is mounted by either securing the heatsink to the IC via clips that attach to the underside of the IC package (i.e., piggyback mounting), or mounting the heatsink to the PCB using spring clips or screws. Piggyback mounts are typically not used with ICs having a low profile package, such as a quad flat pack (QFP) or a ball grid array (BGA) package, because there is minimal gap between the IC and the PCB for attaching the heatsink. Attaching the heatsink to the PCB using spring clips or screws requires isolating the mounting area from the traces of the PCB thereby reducing the available space for circuit routing. As such, knowledge of heatsink placement is required before design and sometimes results in enlargement of the PCB to accommodate the heatsink.

Therefore, a need exists in the art for a heatsink arrangement that provides maximum heat dissipation without being bonded to the IC or being mounted to the PCB or the under edge of the IC package.

SUMMARY OF THE INVENTION

The disadvantages associated with the prior art are overcome by an apparatus for dissipating heat from a circuit element mounted to a PCB. In an embodiment of the invention, a heatsink for dissipating heat from an (Integrated Circuit) IC mounted to the PCB is coupled to a surrounding structure of the PCB. The surrounding structure is a RF shield. The heatsink comprises a connector for thermal contact with an IC, and a pair of arms for dissipating heat and for coupling the heatsink to the surrounding structure without contacting the PCB. If the ICs have electrically conductive packages, non-electrically conductive thermal spacers are inserted between the connector and the corresponding IC to electrically isolate the heatsink from the IC. Additionally, each arm has a tip extending perpendicularly therefrom, substantially increasing the surface area thereof for increased heat dissipation and for structural stability.

The heatsink is mounted to the surrounding structure using bumps attached to the tips of each arm. Holes in the surrounding structure accept the bumps attached to the tips of each arm. In alternative embodiments of the invention, the heatsink is coupled to slots or holes in the surrounding structure via rivets, pin plugs, pegs or screws on the tips of the arms of the heatsink. Because the heatsink does not come into contact with the PCB, the PCB can be made smaller and trace routing is maximized.

Further embodiments of the present invention will become apparent from the detailed description contained hereinafter. It should be understood, however, that the detailed description and specific examples are given by way of illustration only, since various changes and modifications within the spirit and scope of the invention will become apparent to those skilled in the art from this detailed description.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
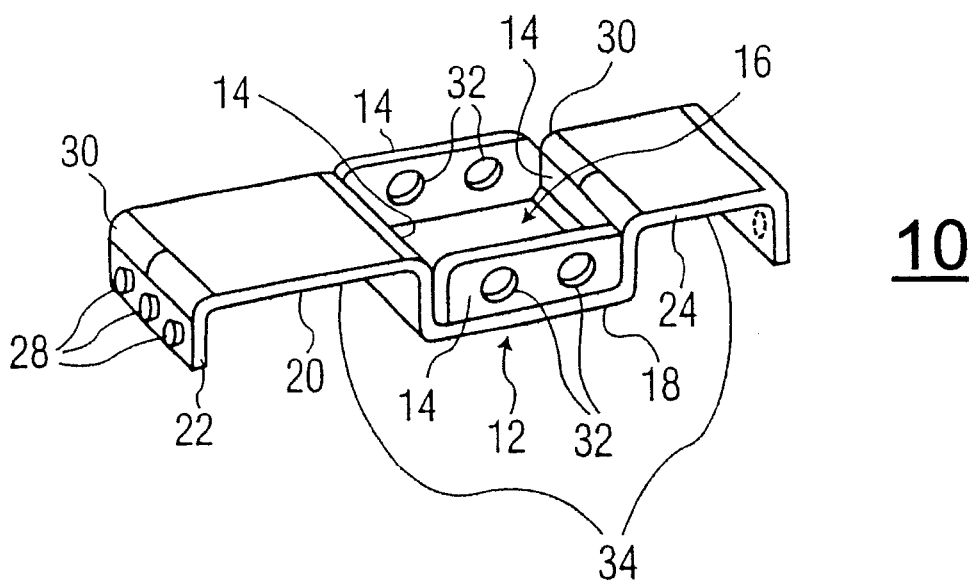
FIG. 1 illustrates an embodiment of a heatsink according to the present invention.

FIG. 1 illustrates an embodiment of a heatsink 10 according to the present invention. Specifically, the heatsink 10 comprises a rectangular left arm 20, a rectangular connecting member 12, and a rectangular right arm 24. It will be appreciated by those skilled in the art that connecting member 12, left arm 20 and right arm 24 may also be formed using non-rectangular shapes. Moreover, it will be appreciated that while the heatsink 10 of FIG. 1 is described primarily in rectangular and other specific shapes, various modifications to such shapes are contemplated by the inventor and within the scope of the present invention.

Figure 2:
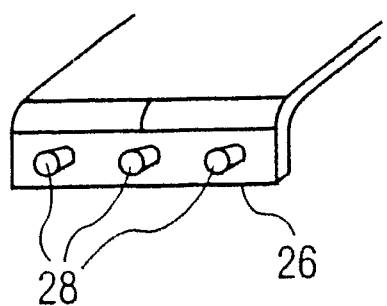
FIG. 2 depicts the right tip portion of the heat sink of FIG. 1.

Rectangular connecting member 12 includes side walls 14, an open top 16 and an opposing open bottom 18. Extending perpendicularly from one of said side walls 14 is a left arm 20. A left tip 22 extends perpendicularly from substantially the majority of the width of the left arm 20. Extending perpendicularly from one of said side walls 14 opposite the left arm 20 is a right arm 24. A right tip 26 (FIG. 2) extends perpendicularly from and substantially the majority of the width of right arm 24. Together left arm 20 and right arm 24 comprise a pair of arms 34. On the outer surface of each tip is a plurality of bumps 28 and on each side wall is a plurality of holes 32.

Heatsink 10 is made out of a thermally conductive material such as aluminum. Important bends of heatsink 10 include gussets 30, which provide mechanical strength to avoid deformation and have adequate bend radii so as not to restrict the conductive flow of heat through the metal.

Connecting member 12 is designed to mechanically mate with the desired circuit element using an interference or compression fit, whereby adequate pressure can be applied to ensure heat transfer from the circuit element to heatsink 10. That is, the interference fit provides mechanical support and low thermal resistance by ensuring a minimum "contact patch" between the heatsink 10 and a circuit element producing a great amount of heat dispersion. Heat sink 10 is designed so that connecting member 12 sits on top of the circuit element. Heat is drawn from the circuit element into side walls 14 and dispersed to pair of arms 34 and to the air, for example, via open top 16 and open bottom 18.

Connecting member 12 can be in direct contact with a circuit element having a non-electrically conductive package (e.g., ceramic package), or if the circuit element has a metal package, can be thermally coupled to the circuit element with conductive spacers that are electrical insulators. Although the heatsink 10 of FIG. 1 is made of aluminum, it is understood by those skilled in the art that heatsink 10 can be made of any thermally conductive material (e.g. metal, metal composite, polymer).

Figure 3:
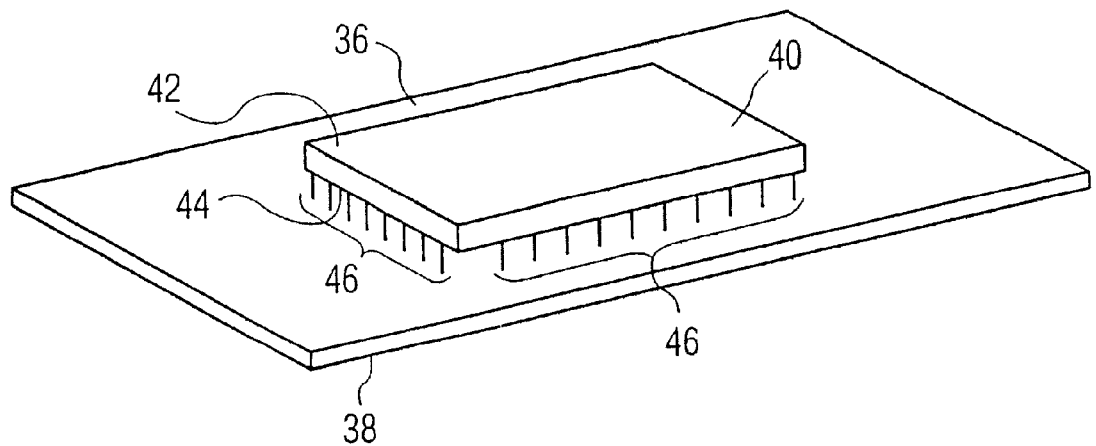
FIG. 3 depicts an isometric view of a circuit element mounted to a printed circuit board.

FIG. 3 depicts an isometric view of a circuit element 36 mounted to a printed circuit board (PCB) 38. The circuit element 36 comprises, illustratively, an integrated circuit (IC) encapsulated within a package 40 that has a substantially planar top surface 42 and opposing bottom surface 44, such as a quad flat pack (QFP) or ball grid array (BGA) package. Leads 46 are connected to the IC within the package 40 and extend outward for attachment to PCB 38.

While the present invention has been illustrated for enhanced cooling of a packaged IC, it will be appreciated that the inventive principles can be utilized with any heat generating circuit element. Such element does not necessarily require a planar surface, since a conductive compound can be utilized to ensure good surface contact on non-planar surfaces. Further, while conventional leads 46 have been illustrated for mounting the circuit element 36 to the PCB 38, it will be appreciated by those skilled in the art that the invention can be practiced with circuit elements having other types of connection elements, such as ball grid solder bumps.

Figure 4:
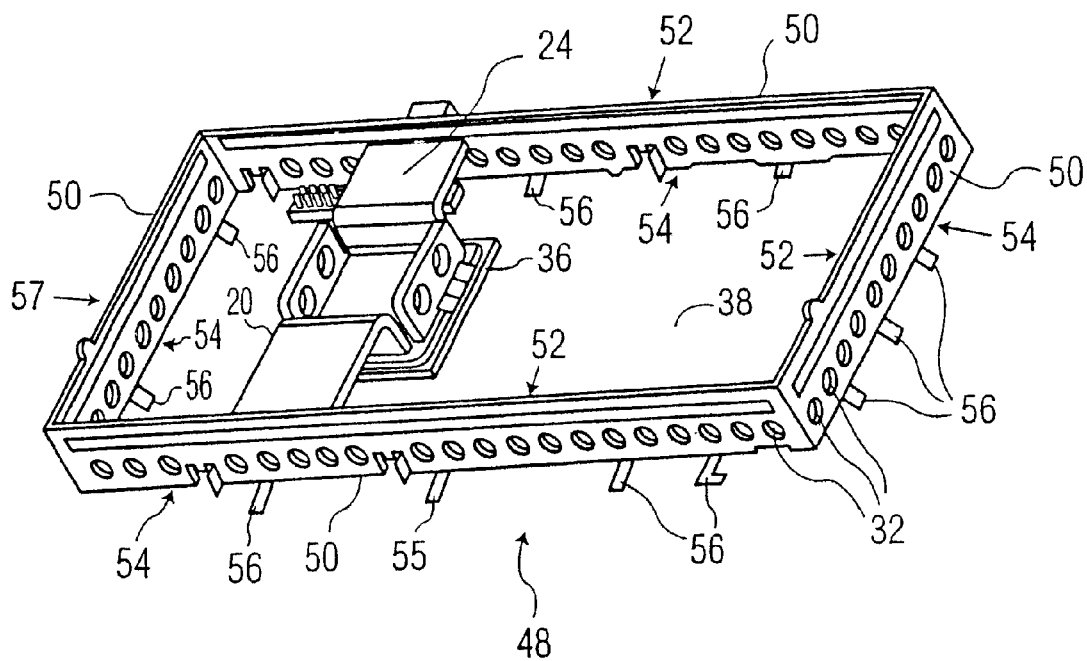
FIG. 4 depicts the heatsink coupled to a structure and in thermal contact with a circuit element.

FIG. 4 depicts an assembly including a heatsink according to the present invention. Specifically, FIG. 4 depicts an isometric view of an structure or module comprising a heatsink formed according to the present invention cooperating with an structure 48 to contain a PCB 38 including integrated circuits thermally cooperating with the heatsink. The heatsink mechanically cooperates with the structure 48 and the PCB 38 to form a compression fit such that a path of low thermal resistance is formed between the heatsink and integrated circuits on the PC board to be cooled.

The structure 48 comprises side walls perpendicularly oriented with respect to the edges of the PCB 38. Other shapes (e.g., round, oval, etc.) and orientations including portions or the entirety of the PCB 38 are also within the scope of the present invention.

FIG. 4 depicts the heatsink 10 of the present invention coupled to structure 48 surrounding the PCB 38. Structure 48 comprises a side wall 50 on each side of the PCB 38. Each of the side walls 50 includes a top edge 52 and a bottom edge 54, where the bottom edge 54 of each of the side walls 50 includes downwardly extending plurality of solder tabs 56. The plurality of solder tabs 56 are used to attach structure 48 to the PCB 38. Other devices for connecting the structure 48 to the PCB 38 are also within the scope of the invention. Dispersed throughout each side walls 50 are a plurality of holes 32. Other types of perforations (i.e. slots and the like) may be used. Structure 48 is any surrounding structure of PCB 38, for example, an RF shield or chassis.

In this illustrative embodiment, the pair of arms 34 of heatsink 10 is depicted as being attached to the structure 48 via the bumps 28 and holes 32 of the respective devices. Although heatsink 10 and structure 48 are depicted as having bumps 28 and holes 32 respectively, other methods of attachment may be used, for example, slots, rivets, pins, plugs, pegs, screws or combinations thereof. Additionally, heatsink 10 is depicted as being removable from structure 48 but it can also be permanently locked into place.

Pair of arms 34 also provide a large surface area for dissipating heat away from circuit element 36 when an electronic component 36 is in thermal contact with connecting member 12. Although it is not depicted, thermally conductive spacers that are electrical insulators can be used with the present invention. The spacers can be used for example when electronic component 36 has a metal structure that is not electrically isolated. Additionally, thermally conductive spacers can also be used where there is an insufficient amount of interference between the heatsink and the electronic component.

Thus, as described, the present invention provides for enhanced cooling of a conventional electronic component by making available, on the top surface of the component, an additional surface for heat dissipation. By utilizing an arrangement whereby the present invention is coupled to a chassis structure, heat is dissipated from the electronic component to the surrounding air. This is accomplished without requiring the design of customized components.

Although various embodiments which incorporate the teachings of the present invention have been shown and described in detail herein, those skilled in the art can readily devise many other varied embodiments that still incorporate these teachings.

What is claimed is:

1. An apparatus for dissipating heat from a circuit element attached to a printed circuit board (PCB) said apparatus comprising:

a chassis comprising a member having at least two opposing sidewalls, each sidewall having a plurality of holes formed therein and spaced apart by a predetermined distance;

said PCB being attached to said chassis without covering said to holes in said sidewalls;

a heatsink having arms extending from a connector member in mechanical and thermal contact with said circuit element without touching any portion of the surface of said PCB and including tips attached to said arms;

a coupling member attached to said tips, for securing said heatsink to said opposing side walls of said chassis; and wherein said coupling member comprising a plurality of bumps disposed on said tips, said bumps being spaced apart by said given distance for engaging respective ones of said holes and not fixed to said holes for enabling manual engagement and disengagement of said heat sink.

2. The apparatus of claim 1 wherein said chassis comprises a radio frequency (RF) shield.

3. The apparatus of claim 1 wherein said circuit element comprises one of a quad flat pack (QFP) and a ball grid array (BGA) package.

* * * * *